(12) United States Patent
Xia et al.

(10) Patent No.: US 11,984,460 B2
(45) Date of Patent: May 14, 2024

(54) INSULATION UNIT BASED ON ARRAY SUBSTRATE AND MANUFACTURING METHOD THEREOF, ARRAY SUBSTRATE AND MANUFACTURING METHOD THEREOF, AND ELECTRONIC DEVICE

(71) Applicants: Beihai HKC Optoelectronics Technology Co., Ltd., Beihai (CN); HKC Corporation Limited, Shenzhen (CN)

(72) Inventors: Yuming Xia, Shenzhen (CN); En-Tsung Cho, Shenzhen (CN); Haijiang Yuan, Shenzhen (CN)

(73) Assignees: BEIHAI HKC OPTOELECTRONICS TECHNOLOGY CO., LTD., Beihai (CN); HKC CORPORATION LIMITED, Shenzhen (CN)

( * ) Notice: Subject to any disclaimer, the term of this patent is extended or adjusted under 35 U.S.C. 154(b) by 275 days.

(21) Appl. No.: 17/354,152

(22) Filed: Jun. 22, 2021

(65) Prior Publication Data

US 2022/0093651 A1  Mar. 24, 2022

(30) Foreign Application Priority Data

Sep. 23, 2020  (CN) .................... 202011009171.2

(51) Int. Cl.
*H01L 27/12* (2006.01)

(52) U.S. Cl.
CPC ...... *H01L 27/1259* (2013.01); *H01L 27/1237* (2013.01); *H01L 27/1248* (2013.01); *H01L 27/127* (2013.01)

(58) Field of Classification Search
CPC ............ H01L 27/1237; H01L 27/1248; H01L 27/1259
See application file for complete search history.

(56) References Cited

U.S. PATENT DOCUMENTS 5,633,738 A * 5/1997 Wakui ............... G02F 1/136286
349/46
6,049,092 A  4/2000 Konuma et al.
(Continued)

FOREIGN PATENT DOCUMENTS

CN  1109220 A  9/1995
CN  102332404 A  1/2012
(Continued)

OTHER PUBLICATIONS

X. Xiao et al., "Room-Temperature-Processed Flexible Amorphous InGaZnO Thin Film Transistor," ACS Appl. Mater. Interfaces 2018, 10, 25850-25857. (Year: 2018).*

*Primary Examiner* — Peter M Albrecht
(74) *Attorney, Agent, or Firm* — Franklin & Associates International Inc; Matthew F. Lambrinos

(57) ABSTRACT

The present disclosure relates to an insulation unit based on an array substrate and a manufacturing method thereof, an array substrate and a manufacturing method thereof, and a display mechanism. The method for manufacturing the insulation unit based on the array substrate includes: providing an aluminum layer on a substrate; and anodizing the aluminum layer to oxidize the aluminum layer to form the insulation unit. The method for manufacturing the insulation unit based on the array substrate can manufacture an insulation unit with a better corrosion resistance.

18 Claims, 5 Drawing Sheets

(56) References Cited

U.S. PATENT DOCUMENTS

| | | | |
|---|---|---|---|
| 2004/0051100 A1* | 3/2004 | Yamazaki | H01L 27/1248 257/59 |
| 2017/0148821 A1 | 5/2017 | Yuan et al. | |
| 2017/0256421 A1* | 9/2017 | Liu | H01L 21/44 |
| 2020/0152458 A1 | 5/2020 | Song et al. | |
| 2020/0203391 A1 | 6/2020 | Liu | |
| 2021/0210621 A1 | 7/2021 | Cao et al. | |

FOREIGN PATENT DOCUMENTS

| | | | |
|---|---|---|---|
| CN | 102522429 A * | 6/2012 | |
| CN | 102623510 A | 8/2012 | |
| CN | 102864479 A | 1/2013 | |
| CN | 104966674 A | 10/2015 | |
| CN | 105374748 A | 3/2016 | |
| CN | 106876481 A | 6/2017 | |
| CN | 107611025 A | 1/2018 | |
| CN | 108346703 A | 7/2018 | |
| CN | 108615735 A | 10/2018 | |
| CN | 109461660 A | 3/2019 | |
| CN | 109786321 A | 5/2019 | |
| CN | 110047915 A | 7/2019 | |
| CN | 110942995 A | 3/2020 | |
| CN | 110998857 A | 4/2020 | |
| CN | 111403337 A | 7/2020 | |
| JP | H052191 A | 1/1993 | |
| KR | 20170093323 A | 8/2017 | |

* cited by examiner

INSULATION UNIT BASED ON ARRAY SUBSTRATE AND MANUFACTURING METHOD THEREOF, ARRAY SUBSTRATE AND MANUFACTURING METHOD THEREOF, AND ELECTRONIC DEVICE

CROSS REFERENCE TO RELATED APPLICATION

The application claims priority to Chinese Patent Application No. 202011009171.2, filed on Sep. 23, 2020 and entitled "Insulation Unit Based On Array Substrate and Manufacturing Method Thereof, Array Substrate and Manufacturing Method Thereof, and Electronic Device", which is incorporated herein by reference in its entirety.

TECHNICAL FIELD

The present disclosure relates to the field of display technology, and particularly to an insulation unit based on an array substrate and a manufacturing method thereof, an array substrate and a manufacturing method thereof, and an electronic device.

BACKGROUND

The Thin Film Transistor-Liquid Crystal Display (TFT-LCD) has properties such as a lower power consumption, an excellent image quality and a higher production yield, and has gradually occupied the leading position in the display field. The TFT-LCD includes a display panel and a backlight module. The display panel includes a color film substrate and a thin film transistor array substrate which are spaced. On a side of the color film substrate adjacent to the thin film transistor array substrate and a side of the thin film transistor array substrate adjacent to the color film substrate are provided transparent electrodes. Liquid crystal molecules are provided between the color film substrate and the thin film crystal. The display panel changes the polarization state of light by controlling the orientation of the liquid crystal molecules by the electric field, and implements the penetration and blocking of the optical path by means of the polarizer to achieve the purpose of display. Therefore, the manufacture of a high-performance thin film transistor array (TFT) is a basis of a high-quality LCD.

In the manufacturing process of the TFT, various conducting layers need to be formed to implement the electric driving of the liquid crystals, and an insulating layer needs to be formed on the conducting layer to protect each conducting layer. For example, a gate insulating layer needs to be formed on the surface of the gate, an insulating passivation layer needs to be formed on the surfaces of the source and drain electrodes. However, the corrosion resistance of the general insulating layer is not satisfied and cannot meet the actual requirements.

SUMMARY

In view of this, it is necessary to provide a method for manufacturing an insulation unit based on an array substrate with a better corrosion resistance.

Furthermore, an insulation unit based on an array substrate, an array substrate and a manufacturing method thereof, and an electronic device are further provided.

A method for manufacturing an insulation unit based on an array substrate, includes:

providing an aluminum layer on a substrate; and
anodizing the aluminum layer to oxidize the aluminum layer to form the insulation unit.

In the above method for manufacturing the insulation unit based on the array substrate, the aluminum layer is provided on the substrate, and the aluminum layer is anodized to oxidize the aluminum layer to form aluminum oxide. The aluminum oxide has a stronger corrosion resistance and enables the insulation unit to have a stronger corrosion resistance. Tests have verified that the insulation unit obtained by the above method for manufacturing the insulation unit based on the array substrate has a better corrosion resistance, and the surface of the sample did not change significantly for 72 hours under the conditions of the neutral salt spray (NSS) test.

In an embodiment, the anodizing the aluminum layer to oxidize the aluminum layer to form the insulation unit includes: anodizing the aluminum layer in a first electrolyte to oxidize the aluminum layer to form a barrier layer to obtain the insulation unit; the first electrolyte includes at least one of borate with a mass percentage of 1% to 8%, phosphate with a mass percentage of 3% to 20%, and tartaric acid with a mass percentage of 5% to 25%.

In an embodiment, the method further includes: after anodizing the aluminum layer in the first electrolyte to oxidize the aluminum layer to form the barrier layer, placing the aluminum layer with the barrier layer in a second electrolyte for anodization, to partially oxidize the barrier layer to form a porous layer, wherein the porous layer and an unoxidized portion of the barrier layer form the insulation unit, and the second electrolyte comprises at least one of $H_2SO_4$ with a concentration of 0.2 mol/L to 0.6 mol/L, $H_3PO_4$ with a concentration of 0.1 mol/L to 0.5 mol/L, and HOOCCOOH with a concentration of 0.2 mol/L to 0.8 mol/L.

In an embodiment, the anodizing the aluminum layer to oxidize the aluminum layer to form the insulation unit includes: anodizing the aluminum layer under a first oxidation current to oxidize the aluminum layer to form a barrier layer to obtain the insulation unit, and a density of the first oxidation current is in a range of 0.01 $mA/cm^2$ to 0.1 $mA/cm^2$.

In an embodiment, the method further includes: after anodizing the aluminum layer under the first oxidation current to oxidize the aluminum layer to form the barrier layer, anodizing the aluminum layer with the barrier layer under a second oxidation current to partially oxidize the barrier layer to form a porous layer, wherein the porous layer and an unoxidized portion of the barrier layer form the insulation unit, and a density of the second oxidation current is in a range of 0.4 $mA/cm^2$ to 2 $mA/cm^2$.

In an embodiment, the insulation unit is a gate insulating layer, and the anodizing the aluminum layer to oxidize the aluminum layer to form the insulation unit includes:

forming a photoresist layer on a side of the aluminum layer away from the substrate;

exposing and then developing the photoresist layer;

etching the aluminum layer on which the developed photoresist layer is formed, to remove the photoresist layer to obtain the aluminum layer with a gate pattern; and anodizing the aluminum layer with the gate pattern to oxidize a surface of the aluminum layer to form the insulation unit, wherein an unoxidized portion of the aluminum layer is a gate, and the insulation unit covers the gate.

In an embodiment, the providing the aluminum layer on the substrate includes:

forming a gate on the substrate, forming a gate insulating layer on a side of the substrate adjacent to the gate, the gate insulating layer covering the gate;

forming an active layer on a side of the gate insulating layer away from the substrate;

forming source and drain electrodes on a side of the active layer away from the gate insulating layer; and forming an aluminum layer on a side of the substrate adjacent to the active layer, the aluminum layer covering the gate insulating layer, the active layer, and the source and drain electrodes.

An insulation unit based on an array substrate is provided, which is manufactured by the above-mentioned method for manufacturing the insulating unit based on the array substrate.

A method for manufacturing an array substrate, includes:
providing an aluminum layer on a substrate; and
anodizing the aluminum layer to oxidize a surface of the aluminum layer to form a gate insulating layer, an unoxidized portion of the aluminum layer being a gate, and the gate insulating layer covering the gate to obtain the array substrate.

In an embodiment, the anodizing the aluminum layer includes: anodizing the aluminum layer in an electrolyte; the electrolyte includes at least one of borate with a mass percentage of 1% to 8%, phosphate with a mass percentage of 3% to 20%, and tartaric acid with a mass percentage of 5% to 25%.

In an embodiment, the anodizing the aluminum layer includes: anodizing the aluminum layer under an oxidation current; a density of the oxidation current is in a range of 0.01 mA/cm$^2$ to 0.1 mA/cm$^2$.

In an embodiment, the method further includes:
after anodizing the aluminum layer to oxidize the surface of the aluminum layer to form the gate insulating layer,
forming an active layer on a side of the gate insulating layer away from the substrate;
forming source and drain electrodes on a side of the active layer away from the gate insulating layer;
forming a metal layer on a side of the substrate adjacent to the active layer, the metal layer covering the gate insulating layer, the active layer, and the source and drain electrodes, a material of the metal layer being aluminum;
anodizing the metal layer to oxidize the metal layer to form an insulating protective layer.

In an embodiment, the anodizing the metal layer to oxidize the metal layer to form the insulating protective layer includes:
anodizing the metal layer in a first electrolyte to oxidize the metal layer to form a barrier layer, wherein the first electrolyte includes at least one of borate with a mass percentage of 1% to 8%, phosphate with a mass percentage of 3% to 20% and tartaric acid with a mass percentage of 5% to 25%; and
anodizing the metal layer with the barrier layer in a second electrolyte to partially oxidize the barrier layer to form a porous layer, the porous layer and an unoxidized portion of the barrier layer forming the insulating protective layer, the second electrolyte including at least one of H$_2$SO$_4$ with a concentration of 0.2 mol/L to 0.6 mol/L, H$_3$PO$_4$ with a concentration of 0.1 mol/L to 0.5 mol/L, and HOOCCOOH with a concentration of 0.2 mol/L to 0.8 mol/L.

In an embodiment, the anodizing the metal layer to oxidize the metal layer to form the insulating protective layer includes:
anodizing the metal layer under a first oxidation current to oxidize the metal layer to form a barrier layer, a density of the first oxidation current being in a range of 0.01 mA/cm$^2$ to 0.1 mA/cm$^2$; and
anodizing the metal layer with the barrier layer under a second oxidation current to partially oxidize the barrier layer to form a porous layer, wherein the porous layer and an unoxidized portion of the barrier layer form the insulating protective layer, a density of the second oxidation current is in a range of 0.4 mA/cm$^2$ to 2 mA/cm$^2$.

A method for manufacturing an array substrate, includes:
forming a gate on a substrate, forming a gate insulating layer on a side of the substrate adjacent to the gate, the gate insulating layer covering the gate;
forming an active layer on a side of the gate insulating layer away from the substrate;
forming source and drain electrodes on a side of the active layer away from the gate insulating layer;
forming a metal layer on a side of the substrate adjacent to the active layer, wherein the metal layer covers the gate insulating layer, the active layer, and the source and drain electrodes, a material of the metal layer is aluminum; and
anodizing the metal layer to oxidize the metal layer to form an insulating protective layer to obtain the array substrate.

In an embodiment, the anodizing the metal layer to oxidize the metal layer to form the insulating protective layer includes:
anodizing the metal layer in a first electrolyte to oxidize the metal layer to form a barrier layer, wherein the first electrolyte includes at least one of borate with a mass percentage of 1% to 8%, phosphate with a mass percentage of 3% to 20% and tartaric acid with a mass percentage of 5% to 25%; and
anodizing the metal layer with the barrier layer in a second electrolyte, to partially oxidize the barrier layer to form a porous layer, wherein the porous layer and an unoxidized portion of the barrier layer form the insulating protective layer, the second electrolyte includes at least one of H$_2$SO$_4$ with a concentration of 0.2 mol/L to 0.6 mol/L, H$_3$PO$_4$ with a concentration of 0.1 mol/L to 0.5 mol/L, and HOOCCOOH with a concentration of 0.2 mol/L to 0.8 mol/L.

In an embodiment, the anodizing the metal layer to oxidize the metal layer to form the insulating protective layer includes:
anodizing the metal layer under a first oxidation current to oxidize the metal layer to form a barrier layer, wherein a density of the first oxidation current is less than a preset value, and the preset value is in a range of 0.1 mA/cm$^2$ to 0.4 mA/cm$^2$; and
anodizing the metal layer with the barrier layer under a second oxidation current to partially oxidize the barrier layer to form a porous layer, wherein the porous layer and an unoxidized portion of the barrier layer form the insulating protective layer, a density of the second oxidation current is greater than the preset value.

An array substrate is provided, which is manufactured by the above-mentioned method for manufacturing the array substrate.

An electronic device is provided, which includes the above-mentioned array substrate.

DETAILED DESCRIPTION

In order to facilitate the understanding of the present disclosure, the present disclosure will be described more comprehensively below with reference to relevant accompanying drawings. The accompanying drawings show preferred embodiments of the present disclosure. However, the present disclosure can be implemented in many different manners and is not limited to the embodiments described herein. Rather, the purpose of providing these embodiments is to make the disclosure understood more thoroughly and comprehensively.

Unless otherwise defined, all technical and scientific terms used herein have the same meaning as commonly understood by those skilled in the technical field of the present disclosure. The terms used in the specification of the present disclosure herein are merely for the purpose of describing specific embodiments, and are not intended to limit the present disclosure.

Figure 1:
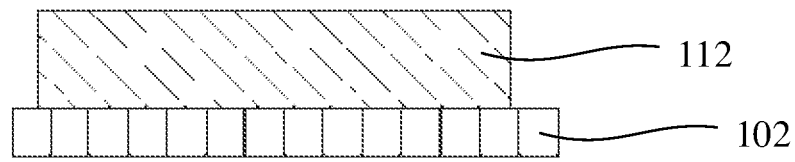
FIG. 1 is a schematic cross-sectional view of a substrate on which an aluminum layer is formed in a method for manufacturing an insulation unit based on an array substrate according to an embodiment I.

As shown in FIG. 1, a method for manufacturing an insulation unit 110 based on an array substrate according to an embodiment I, the insulation unit 110 obtained by the method has a strong corrosion resistance. Specifically, the method includes following steps S110-S140.

S110: an aluminum layer 112 is provided on a substrate 102.

In an embodiment, the substrate 102 is a glass substrate, a plastic substrate or a flexible substrate.

In an embodiment, a thickness of the substrate 102 is in a range of 0.3 mm to 2 mm.

In an embodiment, in the step of providing the aluminum layer 112 on the substrate 102, the aluminum layer 112 is provided on the substrate by a deposition mode. Further, the deposition mode is a vapor deposition or an electrochemical deposition. Furthermore, the deposition mode is a vacuum evaporation, a sputtering coating, an arc plasma coating or an ion coating. It should be noted that the disposition mode by which the aluminum layer 112 is provided on the substrate 102 is not limited to the above-mentioned modes, and other modes, such as electroless plating, atomic layer deposition and the like, can also be used.

In an embodiment, the thickness of the aluminum layer 112 is in a range of 5000 A to 9000 A.

Figure 2:
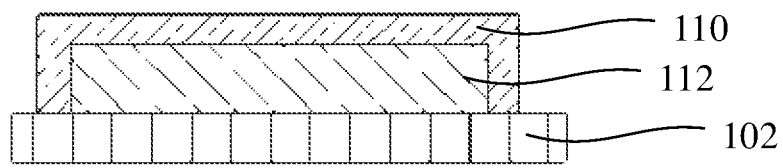
FIG. 2 is a schematic cross-sectional view of the substrate after the insulation unit is formed by anodizing the aluminum layer in the method for manufacturing the insulation unit based on the array substrate shown in FIG. 1.

Please also refer to FIG. 2, S120: the aluminum layer 112 is anodized to oxidize the aluminum layer 112 to form the insulation unit 110.

The aluminum layer 112 is anodized to oxidize the aluminum layer 112 to form the aluminum oxide. The aluminum oxide has a strong corrosion resistance, such that the insulation unit 110 has a strong corrosion resistance.

In an embodiment, the insulation unit 110 is a gate insulating layer, and the step of anodizing the aluminum layer 112 to oxidize the aluminum layer 112 to form the insulation unit 110 includes following steps S121 to S124.

S121: a photoresist layer is formed on a side of the aluminum layer 112 away from the substrate 102.

Specifically, a photoresist is coated on a side of the aluminum layer 112 away from the substrate 102 to obtain the photoresist layer.

S122: the photoresist layer is exposed, and then is developed.

Specifically, the photoresist layer is exposed to light, and then developed to form a groove on the photoresist layer.

S123: the aluminum layer 112 on which the developed photoresist layer is formed is etched to remove the photoresist layer to obtain the aluminum layer 112 having a gate pattern.

In an embodiment, step S123 includes: the aluminum layer 112 on which the developed photoresist layer is formed is placed in an etching solution for etching, and the photoresist layer is peeled off to obtain the aluminum layer 112 having a gate pattern. The etching solution includes acetic acid, phosphoric acid and nitric acid. The etching duration is in a range of 20 s to 80 s.

S124: the aluminum layer 112 having the gate pattern is anodized to oxidize a surface of the aluminum layer 112 to form the insulation unit 110, and an unoxidized portion of the aluminum layer 112 is a gate, and the insulation unit 110 covers the gate.

In an embodiment, the step of anodizing the aluminum layer 112 includes: the aluminum layer 112 is anodized in a first electrolyte to oxidize the aluminum layer 112 to form the insulation unit 110. The first electrolyte includes at least one of borate with a mass percentage of 1% to 8%, phosphate with a mass percentage of 3% to 20%, and tartaric acid with a mass percentage of 5% to 25%. Such arrangement enables the aluminum layer 112 to be oxidized to form alumina with a higher compactness, such that the insulation unit 110 has a higher compactness, hardness, wear resistance, thermal insulation, good corrosion resistance and electrical insulation. Further, the step of anodizing the aluminum layer 112 having the gate pattern includes: the aluminum layer 112 having the gate pattern is anodized in the first electrolyte, to oxidize the aluminum layer 112 to form the insulation unit 110.

In an embodiment, the borate is sodium borate or potassium borate. The phosphate is sodium phosphate or ammonium phosphate.

In an embodiment, the first electrolyte includes at least one of borate with a mass percentage of 3% to 6%, phosphate with a mass percentage of 10% to 15%, and tartaric acid with a mass percentage of 10% to 20%.

In an embodiment, the step of anodizing the aluminum layer 112 in the first electrolyte to oxidize the aluminum layer 112 to form the insulation unit 110 includes: the aluminum layer 112 is anodized in the first electrolyte under a first oxidation voltage, to oxidize the aluminum layer 112 to form the insulation unit. The first oxidation voltage is in a range of 5V to 40V. Further, the aluminum layer 112 having the gate pattern is anodized in the first electrolyte under the first oxidation voltage, to oxidize the aluminum layer 112 to form the insulation unit.

Further, an anodization duration is in a range of 10 s to 90 s. Such arrangement makes the surface of the aluminum layer 112 oxidized to form the insulation unit 110, and an unoxidized portion of the aluminum layer 112 can be used as a gate, such that a gate metal is directly partially oxidized to form the insulation unit 110 to protect the gate. There is no need to additionally provide a metal layer on the gate to form the insulation unit 110 by the oxidation, and the formed insulation unit 110 has a good film quality, few interface defects, a higher electron mobility, and an excellent performance.

Furthermore, a temperature of the anodizing is in a range of 20° C. to 35° C. Since silicon nitride has a higher dielectric constant and a shielding effect on alkaline ions, the current insulating layer of amorphous silicon TFT generally adopts a Plasma Enhanced Chemical Vapor Deposition (PECVD) method to manufacture a silicon nitride material as an insulating layer, but in such method the deposition is performed at a higher temperature (>250° C.), which cannot be applied in flexible display and OLED products, and the manufactured film has a lower density, which affects the performance of the thin film transistors. However, in the above-mentioned embodiment, the insulation unit 110 with better density can be manufactured in the liquid phase at a room temperature, which can be applied to the low-cost manufacturing of the flexible displays and OLEDs, and has a low cost and is easy to produce and use on a large scale.

Figure 3:
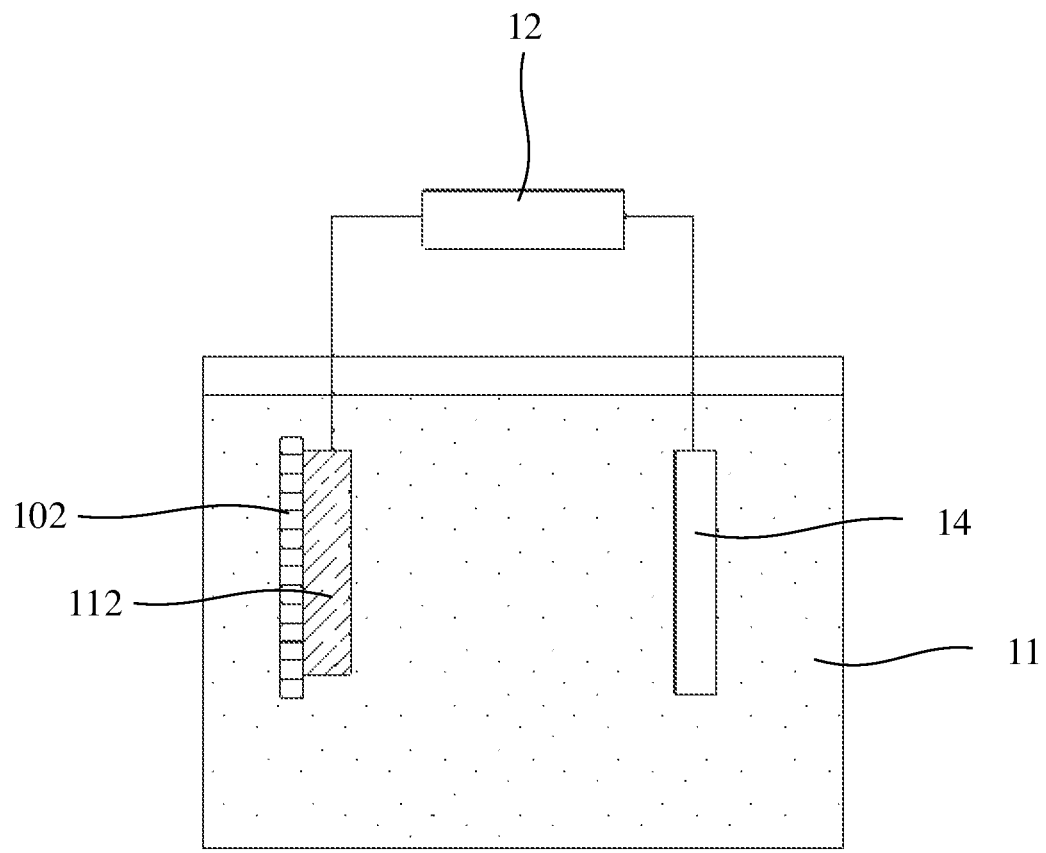
FIG. 3 is a schematic diagram illustrating an operation of anodizing the aluminum layer in the method for manufacturing the insulation unit shown in FIG. 1.
Figure 4:
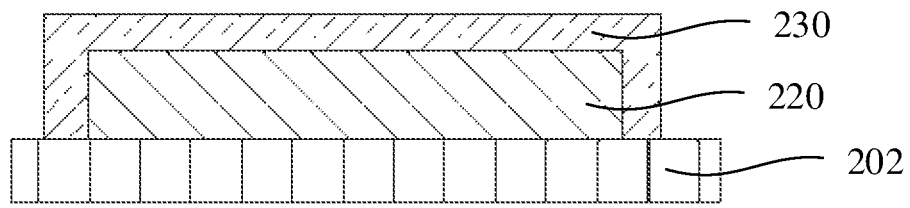
FIG. 4 is a schematic cross-sectional view of a substrate on which a gate and a gate insulating layer are formed in a method for manufacturing an insulation unit based on an array substrate according to an embodiment II.
Figure 5:
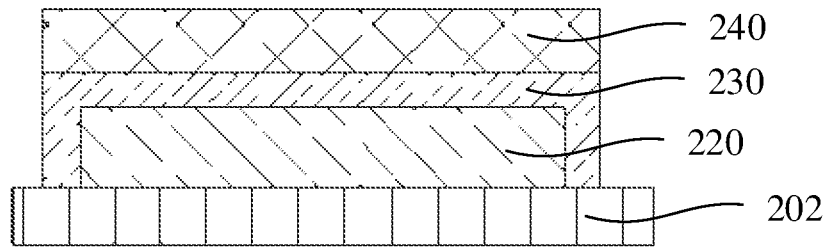
FIG. 5 is a schematic cross-sectional view of the substrate after an active layer is formed on the gate insulating layer in the method for manufacturing the insulation unit shown in FIG. 4.
Figure 6:
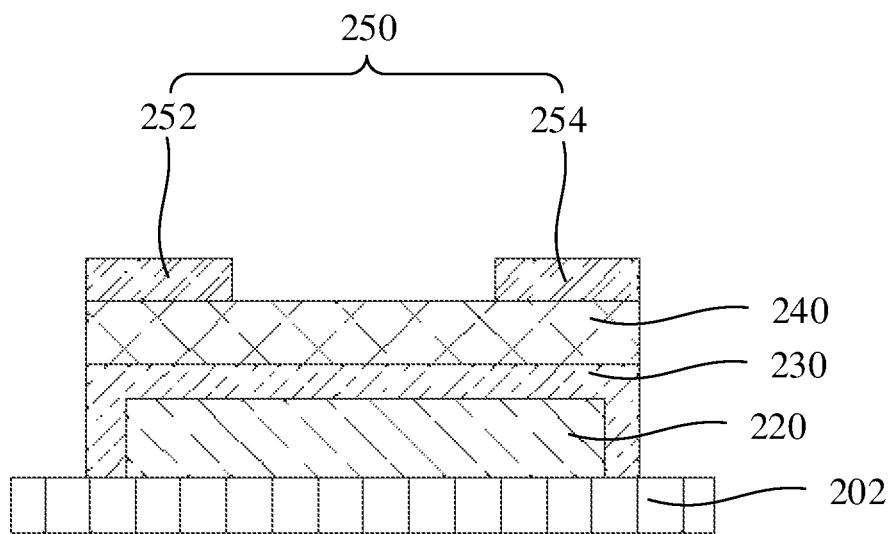
FIG. 6 is a schematic cross-sectional view of the substrate after source and drain electrodes are formed on the active layer in the method for manufacturing the insulation unit shown in FIG. 5.
Figure 7:
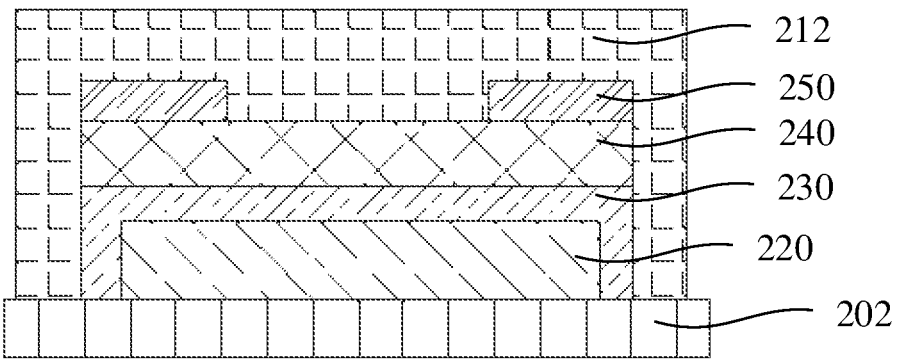
FIG. 7 is a schematic cross-sectional view of the substrate on which an aluminum layer is formed in the method for manufacturing the insulation unit shown in FIG. 6.
Figure 8:
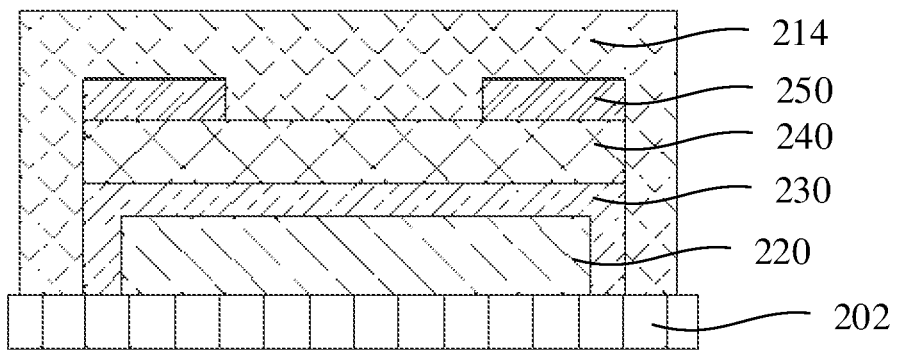
FIG. 8 is a schematic cross-sectional view of the substrate after a barrier layer is formed by anodizing the aluminum layer in the method for manufacturing the insulation unit shown in FIG. 7.
Figure 9:
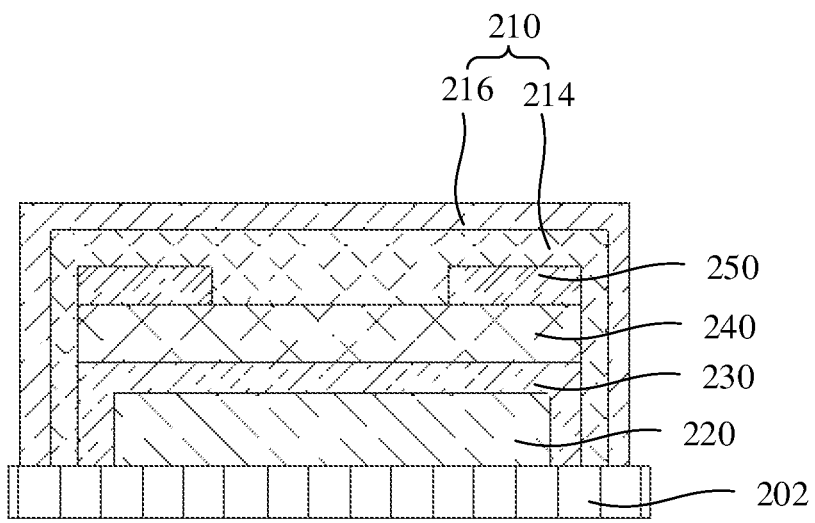
FIG. 9 is a schematic cross-sectional view of the substrate after a porous layer is formed by anodizing the barrier layer in the method for manufacturing the insulation unit shown in FIG. 8.

Please also refer to FIG. 3, in an embodiment, the step of anodizing the aluminum layer 112 to oxidize the aluminum layer 112 to form the insulation unit 110 includes: the substrate 102 formed with the aluminum layer 112 is placed in an electrolytic cell In 11, the aluminum layer 112 and a counter electrode 14 are respectively electrically connected to two ends of a power supply 12 and placed in the electrolyte for electrochemical deposition. Further, an aluminum layer 112 having the gate pattern is placed in the electrolytic cell 11, the aluminum layer 112 and the counter electrode 14 are respectively electrically connected to the two ends of the power supply 12 and placed in the electrolyte for electrochemical deposition. The aluminum layer 112 is provided opposite to the counter electrode 14. The power supply 12 is a DC power supply.

In an embodiment, the thickness of the insulation unit 110 is in a range of 2500 A to 4000 A.

In the method for manufacturing the insulation unit 110 based on the array substrate described in the above embodiment, the aluminum layer 112 is provided on the substrate 102, and the aluminum layer 112 is anodized to oxidize the aluminum layer 112 to form the aluminum oxide. The aluminum oxide has a stronger corrosion resistance, so that the insulation unit 110 has a stronger corrosion resistance. Tests have verified that the insulation unit 110 obtained by the above-mentioned method for manufacturing the insulation unit 110 based on the array substrate has a better corrosion resistance, and the surface of the sample did not change significantly for 72 hours under the conditions of the neutral salt spray (NSS) test.

Further, in the method for manufacturing the insulation unit 110 based on the array substrate described in the above embodiment, by anodizing the aluminum layer 112 in the first electrolyte, the insulation unit 110 having higher compactness, hardness, wear resistance and thermal insulation, good corrosion resistance and electrical insulation can be obtained.

The gate insulating layer has both switching and insulating functions. Thus, the gate insulating layer is both a dielectric and an insulating medium. The thicker the film, the better the film quality, and the higher the degree of insulation withstand voltage of the gate insulating layer, and the lower the probability of short circuit of the TFT circuit. But the thicker the film, the on-state current and off-state current decrease. Therefore, the choice of the thickness of the gate insulating layer should take into account both switching characteristics and insulation characteristics. In the method for manufacturing the insulation unit 110 based on the array substrate in the above embodiment, the insulation unit 110 can be used as a gate insulating layer, and the thickness of the insulation unit 110 can be precisely controlled by selecting a specific first electrolyte, such that the thickness of the gate insulating layer is controllable.

Please also refer to FIGS. 4 to 9, a method for manufacturing an insulation unit 210 based on an array substrate according to an embodiment II includes following steps S210 to S220.

S210: an aluminum layer 212 is provided on a substrate 202.

In an embodiment, the step S210 includes following steps S211 to S214.

S211: a gate 220 is formed on the substrate 202, a gate insulating layer 230 is formed on a side of the substrate 202 adjacent to the gate 220, and the gate insulating layer 230 covers the gate 220.

In an embodiment, the operation of S211 is the same as the process of manufacturing the insulation unit 110 based on the array substrate in the embodiment I. The insulation unit 110 is the gate insulating layer 230 and the unoxidized portion of the aluminum layer 112 is the gate 220. Please refer to the above for details and will not be repeated here.

S212: an active layer 240 is formed on a side of the gate insulating layer 230 away from the substrate 202.

In an embodiment, the active layer 240 is formed on the side of the gate insulating layer 230 away from the substrate 202 by the deposition process. Further, the deposition mode is a vapor deposition or an electrochemical deposition. Furthermore, the deposition mode is a vacuum evaporation, a sputtering coating, an arc plasma coating or an ion coating.

In an embodiment, the active layer 240 is a semiconductor layer. Further, the active layer 240 is an amorphous silicon layer. It should be noted that the active layer 240 is not limited to the amorphous silicon layer, and may also be other semiconductor layers, such as zinc oxide, gallium zinc oxide, and the like.

In an embodiment, a thickness of the active layer 240 is in a range of 800 A to 2000 A.

S213: source and drain electrodes 250 are formed on a side of the active layer 240 away from the gate insulating layer 230.

In an embodiment, the thickness of the source and drain electrodes 250 is in a range of 2500 A to 5000 A.

In an embodiment, one portion of the source and drain electrodes 250 covers a side of the gate insulating layer 230 away from the substrate 202, and the other portion covers a surface of the active layer 240.

Further, the source and drain electrodes 250 include a drain electrode 252 and a source electrode 254. The drain electrode 252 and the source electrode 254 are spaced apart. One portion of the drain electrode 252 covers a side of the gate insulating layer 230 away from the substrate 202, and the other portion covers the surface of the active layer 240. One portion of the source electrode 254 covers a side of the gate insulating layer 230 away from the substrate 202, and the other portion covers the surface of the active layer 240.

S214: an aluminum layer 212 is formed on a side of the substrate 202 adjacent to the active layer 240, the aluminum layer 212 covers the gate insulating layer 230, the active layer 240 and the source and drain electrodes 250.

In an embodiment, the substrate 202 is a glass substrate, a plastic substrate or a flexible substrate.

In an embodiment, the thickness of the substrate 202 is in a range of 0.5 mm to 2 mm.

In an embodiment, in the step of providing the aluminum layer 212 on the substrate 202, the aluminum layer 212 is provided on the substrate by the deposition. Further, the deposition mode is a vapor deposition or an electrochemical deposition. Furthermore, the deposition mode is a vacuum evaporation, a sputtering coating, an arc plasma coating or an ion coating. It should be noted that the mode of providing the aluminum layer 212 on the substrate 202 is not limited to the above modes, and other modes can also be used, such as electroless plating, atomic layer deposition, and the like. In an embodiment, the thickness of the aluminum layer 212 is in a range of 2000 A to 4000 A.

In an embodiment, after the step S213 and before the step S214, the method further includes that an ohmic contact layer is provided on a side of the active layer 240 away from the gate insulating layer 230, the ohmic contact layer is located between the active layer 240 and the source and drain electrodes 250. By providing the ohmic contact layer between the source and drain electrodes 250 and the active layer 240, it is beneficial to reduce a contact resistance between the drain electrode and the active layer 240, and is beneficial to reduce a contact resistance between the source electrode and the active layer 240.

S220: the aluminum layer 212 is anodized to oxidize the aluminum layer 212 to form an insulation unit 210.

In an embodiment, the step S220 includes following steps S221 to S222.

S221: the aluminum layer 212 is anodized in the first electrolyte to oxidize the aluminum layer 212 to form the barrier layer 214. The first electrolyte includes at least one of borate with a mass percentage of 1% to 8%, phosphate with a mass percentage of 3% to 20%, and tartaric acid with a mass percentage of 5% to 25%. Such arrangement enables the aluminum layer 212 to be oxidized to form aluminum oxide with a higher compactness, and then to form the barrier layer 24 having a higher compactness, a higher hardness, a higher wear resistance, a better corrosion resistance, good electrical insulation, and a higher thermal insulation, such that the insulation unit 210 has a higher compactness, a higher hardness, higher wear resistance and thermal insulation, and good corrosion resistance and electrical insulation.

Further, the borate is sodium borate or potassium borate. The phosphate is sodium phosphate or ammonium phosphate.

In an embodiment, the first electrolyte includes at least one of borate with a mass percentage of 3% to 6%, phosphate with a mass percentage of 10% to 15%, and tartaric acid with a mass percentage of 10% to 20%.

In an embodiment, the step of anodizing the aluminum layer 212 in the first electrolyte to oxidize the aluminum layer 212 to form the barrier layer 214 includes: the aluminum layer 212 is anodized in the first electrolyte under the first oxidation voltage to oxidize the aluminum layer 212 to form the barrier layer 214. The first oxidation voltage is in a range of 5V to 40V.

Further, an anodization duration is in a range of 20 s to 80 s. Such arrangement makes the aluminum layer 212 completely oxidized to form the barrier layer 214. The barrier layer 214 formed by such arrangement has a good film quality, few interface defects, a high electron mobility, and an excellent performance.

Furthermore, a temperature of the anodizing is in a range of 20° C. to 35° C. Accordingly, the insulation unit 210 with a better compactness can be manufactured in the liquid phase at a room temperature, and can be applied to the low-cost manufacturing of flexible displays and OLEDs, and has a low cost and is easy to produce and use on a large scale.

In an embodiment, the thickness of the barrier layer 214 is in range of 2000 A to 4000 A.

S222: the aluminum layer 212 with the barrier layer 214 is placed in a second electrolyte for anodization, to partially oxidize the barrier layer 214 to form a porous layer 216, and an unoxidized portion of the barrier layer 214 and the porous layer 216 form the insulation unit 210. The second electrolyte includes at least one of $H_2SO_4$ with a concentration of 0.2 mol/L to 0.6 mol/L, $H_3PO_4$ with a concentration of 0.1 mol/L to 0.5 mol/L, and HOOCCOOH with a concentration of 0.2 mol/L to 0.8 mol/L.

In such arrangement, a porous layer 216 with holes is formed on the surface of the barrier layer 214 to increase an adsorption capacity of the barrier layer 214, improve the corrosion resistance and alkali resistance of the insulation unit 210; and the unoxidized portions of the porous layer 216 and the barrier layer 214 make an inner layer of the insulation unit 210 have a better compactness, higher hardness, wear resistance and thermal insulation, good corrosion resistance and electrical insulation, and make an outer layer have a higher adsorption capacity and stronger corrosion resistance and alkali-resistance ability, and have the compactness, hardness, abrasion resistance, thermal insulation, corrosion resistance, electrical insulation, adsorption capacity and alkali resistance.

In an embodiment, the step of placing the aluminum layer 212 with the barrier layer 214 in the second electrolyte for anodization to oxidize the barrier layer 214 to form the porous layer 216 includes: the aluminum layer 212 with the barrier layer 214 is placed in the second electrolyte for anodization under a second oxidation potential, to oxidize the barrier layer 214 to form the porous layer 216. The second oxidation potential is in a range of 3V to 220V. Further, when the second electrolyte is $H_2SO_4$ with the concentration of 0.2 mol/L to 0.6 mol/L, the second oxidation potential is in a range of 3V to 20V. When the second electrolyte is $H_3PO_4$ with the concentration of 0.1 mol/L to 0.5 mol/L, the second oxidation potential is in a range of 20V to 60V. When the second electrolyte is 0.2 mol/L~0.8 mol/L HOOCCOOH, the second oxidation potential is 160V-220V. The above three types of second electrolytes are operated at different voltages, and an aperture of the porous layer is different. The Acetic acid is configured to manufacture a porous layer with a small aperture, and the sulfuric acid and phosphoric acid are configured to manufacture a porous layer with a larger aperture.

Further, a duration for placing the aluminum layer 212 with the barrier layer 214 in the second electrolyte for anodization is in a range of 10 s to 60 s. Such arrangement makes the barrier layer 214 partially oxidized to form the porous layer 216, to improve the corrosion resistance, alkali resistance and adsorption capacity of the insulation unit 210.

Furthermore, a temperature of the anodizing is in a range of 20° C. to 35° C. Accordingly, the insulation unit 210 with a better compactness can be manufactured in the liquid phase at a room temperature, which can be applied to the low-cost manufacturing of flexible displays and OLEDs, and has a low cost and is easy to produce and use in a large scale.

In an embodiment, the thickness of the porous layer 216 is in a range of 500 A to 1500 A.

In an embodiment, the insulation unit 210 is an insulating protective layer of the array substrate.

In the method for manufacturing the insulation unit 210 based on the array substrate in the above embodiment, the aluminum layer 212 is provided on the substrate 202, and the aluminum layer 212 is anodized to oxidize the aluminum layer 212 to form aluminum oxide which has a stronger corrosion resistance such that the insulation unit 210 has a stronger corrosion resistance. Tests have verified that the insulation unit 210 obtained by the above method for manufacturing the insulation unit 210 based on the array substrate has a better corrosion resistance, and the surface of the sample did not change significantly for 72 hours under conditions of the neutral salt spray (NSS) test.

Further, in the method for manufacturing the insulation unit 210 based on the array substrate described in the above embodiment, the barrier layer 214 is formed by anodizing the aluminum layer 212, and the barrier layer 214 is anodized to partially transform into the porous layer 216, such that the insulation unit 210 has the compactness, hardness, abrasion resistance, thermal insulation, corrosion resistance, electrical insulation, adsorption capacity and alkali resistance.

The insulating protective layer has functions of insulating and protecting the external environment and reducing a parasitic capacitance. The insulating protective layer is a key component that generates parasitic TFTs and causes the back channel effect. In order to reduce the parasitic TFT, it is necessary to ensure the shielding effect of the film quality against the alkaline ions and metal pollution, and a moisture resistance also should be good. From a perspective of storage capacitors, the insulating protective layer is required to have a good insulation. Considering the product qualified rate, the insulating protective layer is required to have high protection against mechanical and chemical damages and good sidestep coverage. At present, the plasma enhanced chemical vapor deposition (PECVD) method is mainly utilized to manufacture the silicon nitride material as the insulating layer. The sidestep coverage of this method is dissatisfied, which affects the protection of the lower film layer and reduces the product qualified rate. At the same time, a film manufactured by such method has lower compactness and the performance of the thin film transistor is affected. In the method for manufacturing the insulation unit 210 based on the array substrate described in the above embodiment, through manufacturing the barrier layer 214 with a higher compactness, a deposition rate of the barrier layer 214 can be increased and the hardness and wear resistance of the insulation unit 210 can be ensured. Through transforming the surface of the barrier layer 214 into a loose porous layer 216, the adsorption capacity of the insulation unit 210 can be improved. The manufactured insulation unit 210 can be used as an insulating protective layer. In the subsequent etching process, an etching rate of the porous layer 216 is faster, such that the unoxidized portion of the barrier layer 214 and the porous layer 216 have a sidestep at a junction of the two to improve a via slope angle and prevent undercut (underetch), with a better sidestep coverage.

Finally, in the above method, the insulation unit 210 can be used as an insulating protective layer; through sequentially performing the anodization in the first electrolyte and the second electrolyte, the thickness of the insulation unit 210 can be controlled by controlling different electrolytes, to make the thickness of the insulating protective layer controllable.

It should be understood that the operation of the step S211 is not limited to the operation indicated above, and the gate can also be manufactured by other common manufacturing methods in the display technology field. For example, in other embodiments, a metal layer and a photoresist layer are sequentially arranged on the substrate; through the yellow light processing, the photoresist layer is exposed and developed; and the metal layer is etched to pattern the metal layer to obtain the gate; and an aluminum oxide layer is deposited on the gate to obtain a gate insulating layer.

A method for manufacturing an insulation unit based on an array substrate according to an embodiment III includes following steps S310 to S340.

S310: an aluminum layer is provided on the substrate.

In an embodiment, the operations of steps S310 and S110 are the same. Please refer to the above for details, which will not be repeated here.

S320: the aluminum layer is anodized to oxidize the aluminum layer to form the insulation unit.

In an embodiment, the insulation unit is a gate insulating layer and the step of anodizing the aluminum layer to oxidize the aluminum layer to form the insulation unit includes following steps S321 to S324.

S321: a photoresist layer is formed on a side of the aluminum layer away from the substrate.

Specifically, a photoresist is coated on the side of the aluminum layer away from the substrate to obtain the photoresist layer.

S322: the photoresist layer is exposed, and then developed to form a groove on the photoresist layer.

S323: the aluminum layer on which the developed photoresist layer is formed is etched to remove the photoresist layer to obtain the aluminum layer with a gate pattern.

In an embodiment, the step S323 includes: the aluminum layer with the developed photoresist layer is placed in an etching solution for etching, and the photoresist layer is peeled off to obtain the aluminum layer with the gate pattern. The etching solution includes oxalic acid, phosphoric acid and sulfuric acid. The etching duration is in a range of 20 s to 80 s.

S324: the aluminum layer with the gate pattern is anodized to oxidize the surface of the aluminum layer to form the insulation unit, and an unoxidized portion of the aluminum layer is the gate, and the insulation unit covers the gate.

In an embodiment, the step of anodizing the aluminum layer with the gate pattern includes: the aluminum layer is anodized under a first oxidation current, to oxidize the aluminum layer to form a barrier layer and obtain the insulation unit. The density of the first oxidation current is less than 0.1 mA/cm$^2$. Such arrangement enables the aluminum layer to be oxidized to form aluminum oxide with a higher compactness, and to form the barrier layer with a higher compactness, a higher hardness, a higher wear resistance, a better corrosion resistance, a better electrical insulation, and a better thermal insulation, such that the insulation unit has a higher compactness, a higher hardness, a higher wear resistance and thermal insulation, better corrosion resistance and electrical insulation. Further, the density of the first oxidation current is in a range of 0.01 mA/cm$^2$ to 0.1 mA/cm$^2$.

Further, the duration of the anodization is in a range of 10 s to 90 s. Such arrangement makes the surface of the aluminum layer oxidized to form the insulation unit and the unoxidized portion of the aluminum layer used as a gate, such that the gate metal can be directly partially oxidized to form the insulation unit to protect the gate without additionally providing a metal layer on the gate to oxidize to form the insulation unit, and the formed insulation unit has a good film quality, few interface defects, a higher electron mobility, and an excellent performance.

Furthermore, the temperature of anodization is in a range of 20° C. to 35° C. The insulation unit with better compactness can be manufactured in the liquid phase at a room temperature, which can be applied to the low-cost manufacturing of flexible displays and OLEDs, and has a low cost and is easy to produce in a large scale.

In an embodiment, the step of anodizing the aluminum layer under the first oxidation current includes: the aluminum layer is anodized in the electrolyte under the first oxidation current. The electrolyte includes at least one of borate with a mass percentage of 1% to 8%, phosphate with a mass percentage of 3% to 20%, and tartaric acid with a mass percentage of 5% to 25%.

In an embodiment, the thickness of the barrier layer is in a range of 2500 A to 4000 A.

In the method for manufacturing the insulation unit based on the array substrate described in the above embodiment, the aluminum layer is provided on the substrate and is anodized to oxidize the aluminum layer to form aluminum oxide. The aluminum oxide has a strong corrosion resistance and makes the insulation unit have a stronger corrosion resistance. Tests have verified that the insulation unit obtained by the above-mentioned method for manufacturing the insulation unit based on the array substrate has a stronger corrosion resistance, and the surface of the sample did not change significantly for 72 hours under the conditions of the neutral salt spray (NSS) test.

Further, in the method for manufacturing the insulation unit based on the array substrate described in the above embodiment, by anodizing the aluminum layer under the first oxidation current, the insulation unit having a higher compactness, a higher hardness, a higher wear resistance and thermal insulation, a good corrosion resistance and electrical insulation can be obtained.

In the method for manufacturing the insulation unit based on the array substrate described in the above embodiment, the insulation unit can be used as a gate insulating layer, and the thickness of the insulation unit can be precisely controlled by selecting a specific first oxidation current, to make the thickness of the gate insulating layer controllable.

A method for manufacturing an insulation unit based on an array substrate according to an embodiment IV includes following steps S410 to S440.

S410: an aluminum layer is provided on a substrate.

In an embodiment, the step S410 includes the following steps S411 to S414.

S411: A gate is formed on the substrate, and a gate insulating layer is formed on a side of the substrate adjacent to the gate, and the gate insulating layer covers the gate.

In an embodiment, the operation of the step S411 is the same as that of the step S211. Please refer to the above for details, which will not be repeated here.

S412: an active layer is formed on a side of the gate insulating layer away from the substrate.

In an embodiment, the operation of the step S412 is the same as that of the step S212, please refer to the above for details, which will not be repeated here.

S413: source and drain electrodes are formed on a side of the active layer away from the gate insulating layer.

In an embodiment, the operation of the step S413 is the same as that of the step S213, please refer to the above for details, which will not be repeated here.

S414: an aluminum layer is formed on a side of the substrate adjacent to the active layer, and the aluminum layer covers the gate insulating layer, the active layer and the source and drain electrodes.

In an embodiment, the operation of the step S414 is the same as that of the step S214, and the metal layer is the aluminum layer. Please refer to the above for details, which will not be repeated here.

S420: the aluminum layer is anodized to oxidize the aluminum layer to form the insulation unit.

In an embodiment, the step S420 includes following steps S421 to S422.

S421: the aluminum layer is anodized under the first oxidation current to oxidize the aluminum layer to form a barrier layer, and the density of the first oxidation current is less than 0.1 mA/cm$^2$. Such arrangement enables the aluminum layer to be oxidized to form the aluminum oxide with a higher compactness, and to form the barrier layer having a higher compactness, a high hardness, a high wear resistance, a better corrosion resistance, a better electrical insulation, and a better thermal insulation, such that the insulation unit has a higher compactness, a higher hardness, a higher wear resistance and thermal insulation, a better corrosion resistance and electrical insulation. Further, the density of the first oxidation current is in a range of 0.01 mA/cm$^2$-0.1 mA/cm$^2$.

Further, the duration for anodizing the aluminum layer under the first oxidation current is in a range of 20 s to 80 s. Such arrangement makes the aluminum layer completely oxidized to form the barrier layer. The barrier layer formed by this arrangement has a good film quality, few interface defects, a higher electron mobility and an excellent performance.

Furthermore, a temperature of the anodization is in a range of 20° C. to 35° C. The insulation unit with the better compactness can be manufactured in the liquid phase at a room temperature, which can be applied to the low-cost manufacturing of flexible displays and OLEDs, and has a low cost and is easy to produce in a large scale.

In an embodiment, the step of anodizing the aluminum layer under the first oxidation current includes: the aluminum layer is anodized in the electrolyte under the first oxidation current. The electrolyte includes at least one of borate with a mass percentage of 1% to 8%, phosphate with a mass percentage of 3% to 20%, and tartaric acid with a mass percentage of 5% to 25%.

In an embodiment, the thickness of the barrier layer is in a range of 2000 A to 4000 A.

S422: the aluminum layer with the barrier layer is anodized under a second oxidation current to partially oxidize the barrier layer to form a porous layer, and an unoxidized portion of the barrier layer and the porous layer form the insulation unit; the density of the second oxidation current is greater than 0.4 mA/cm².

The process in which the barrier layer is formed on the aluminum layer and the barrier layer is transformed into the porous layer involves following two reactions: $2Al+3H_2O=Al_2O_3+6H^++6e$ and $Al_2O_3+6H^+=2Al^{3+}+3H_2O$, which are specifically divided into two stages. In a first stage, the barrier layer is formed. At this time, the compact oxide film formed on the aluminum surface completely covers the surface of the aluminum, the resistivity is higher, and the current of the oxidation reaction drops sharply. In a second stage, with the anodic oxidation reaction continues, the barrier layer is dissolved in the electrolyte, the current density gradually increases, and micropores begin to appear.

The above arrangement makes a porous layer with holes formed on the surface of the barrier layer to increase the adsorption capacity of the barrier layer and improve the corrosion resistance and alkali resistance of the insulation unit, and the unoxidized portion of the barrier layer and the porous layer make the inner layer of the insulation unit have a better compactness, a higher hardness, a higher wear resistance and thermal insulation, a better corrosion resistance and electrical insulation, and make the outer layer have a higher adsorption capacity, a stronger corrosion resistance and alkali resistance, and have the compactness, hardness, abrasion resistance, thermal insulation, corrosion resistance, electrical insulation, adsorption capacity and alkali resistance. Further, the density of the second oxidation current is in a range of 0.4 mA/cm² to 2 mA/cm².

Further, the duration for anodizing the aluminum layer with the barrier layer under the second oxidation current is in a range of 10 s to 60 s.

Furthermore, the temperature of the anodization is in a range of 20° C. to 35° C. The insulation unit with the better compactness can be manufactured in the liquid phase at a room temperature, which can be applied to the low-cost manufacturing of flexible displays and OLEDs, and has a low cost and is easy to produce in a large scale.

In an embodiment, the step of anodizing the aluminum layer with the barrier layer under the second oxidation current includes: the aluminum layer with the barrier layer is anodized in the electrolyte under the second oxidation current. The electrolyte includes at least one of borate with a mass percentage of 1% to 8%, phosphate with a mass percentage of 3% to 20%, and tartaric acid with a mass percentage of 5% to 25%.

In an embodiment, the thickness of the porous layer is in a range of 500 A to 1500 A.

In an embodiment, the insulation unit is an insulating protective layer of the array substrate.

In the method for manufacturing the insulation unit based on the array substrate described in the above embodiment, the aluminum layer is provided on the substrate, and the aluminum layer is anodized to oxidize the aluminum layer to form the aluminum oxide. The aluminum oxide has a stronger corrosion resistance and makes the insulation unit have a strong corrosion resistance. Tests have verified that the insulation unit obtained by the above-mentioned method for manufacturing the insulation unit based on the array substrate has a stronger corrosion resistance, and the surface of the sample did not change significantly for 72 hours under the conditions of the neutral salt spray (NSS) test.

Further, in the above-mentioned embodiment, the barrier layer is formed by anodizing the aluminum layer, and the barrier layer is anodized to partially transform into the porous layer, such that the insulation unit has compactness, hardness, wear resistance, thermal insulation, corrosion resistance, electrical insulation, adsorption capacity and alkali resistance.

In the method for manufacturing the insulation unit based on the array substrate described in the above embodiment, the deposition rate of the barrier layer can be increased by manufacturing a barrier layer with a higher compactness, and the hardness and abrasion resistance of the insulation unit can be ensured. The surface of the barrier layer is transformed into the loose porous layer, which can improve the adsorption capacity of the insulation unit; the manufactured insulation unit can be used as an insulating protective layer. In the subsequent etching process, the etching rate of the porous layer is faster, such that there is a sidestep at a junction of the porous layer and the unoxidized portion of the barrier layer, to improve the via slope angle and prevent undercut. The sidestep coverage is better.

Finally, in the above-mentioned method, the insulation unit can be used as an insulating protective layer, and anodization is performed sequentially under the first oxidation current and the second oxidation current, such that the thickness of the insulation unit can be controlled by controlling different oxidation currents to make the thickness of the insulating protective layer controllable.

It should be understood that the operation of the step S411 is not limited to the operations indicated above. In other embodiments, the operation of the step S411 is the same as the process for manufacturing the insulation unit based on the array substrate in the embodiment III. The barrier layer is a gate insulating layer, and the unoxidized portion of the aluminum layer is the gate, please refer to the above for details, which will not be repeated here.

It should be understood that the operation of the step S411 is not limited to the operations indicated above, and the gate and the gate insulating layer can also be manufactured by other common manufacturing methods in the display technology field. For example, in other embodiments, the metal layer and the photoresist layer are sequentially arranged on the substrate; through the yellow light processing, the photoresist layer is exposed and developed, and the metal layer is etched to pattern the metal layer to obtain the gate, and an aluminum oxide layer is deposited on the gate to form the gate insulating layer.

Figure 10:
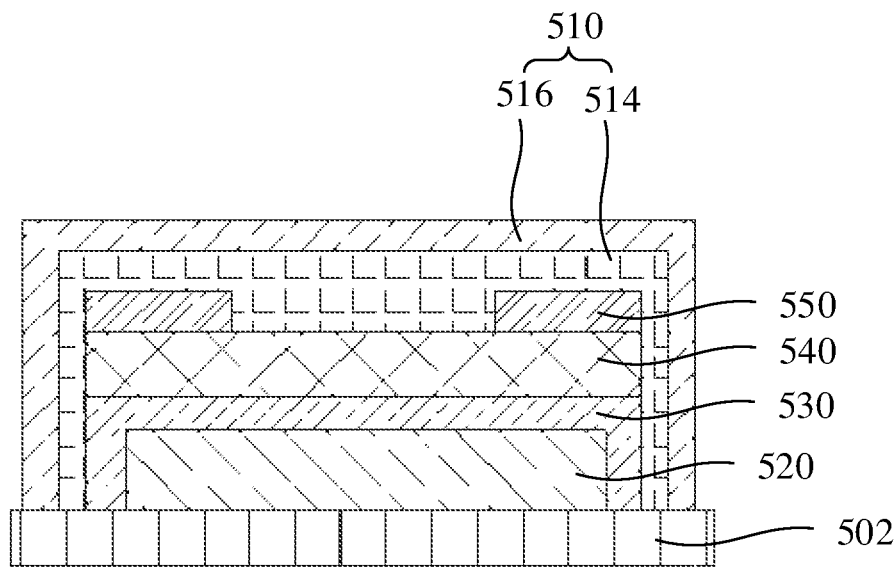
FIG. 10 is a schematic cross-sectional view of an array substrate obtained by using a method for manufacturing an array substrate according to an embodiment.

Also referring to FIG. 10, a method for manufacturing an array substrate 50 provided in an embodiment I includes following steps S510 to S550.

S510: a gate 520 is formed on a substrate 502, a gate insulating layer 530 is formed on a side of the substrate 502 adjacent to the gate 520, and the gate insulating layer 530 covers the gate 520.

In an embodiment, the operation of the step S510 is the same as that of the step S411, please refer to the above for details, which will not be repeated here.

S520: an active layer 540 on a side of the gate insulating layer 530 away from the substrate 502.

In an embodiment, the operation of the step S520 is the same as that of the step S412. Please refer to the above for details, which will not be repeated here.

S530: source and drain electrodes 550 are formed on a side of the active layer 540 away from the gate insulating layer 530.

In an embodiment, the operation of the step S530 is the same as that of the step S413, please refer to the above for details, which will not be repeated here.

S540: a metal layer is formed on a side of the substrate 502 adjacent to the active layer 540, the metal layer covers the gate insulating layer 530, the active layer 540 and the source and drain electrodes 550, and a material of the metal layer is aluminum.

In an embodiment, the operation of the step S540 is the same as that of the step S414, and the metal layer is an aluminum layer, please refer to the above for details, which will not be repeated here.

S550: the metal layer is anodized to oxidize the metal layer to form an insulating protective layer 510 to obtain the array substrate 50.

In an embodiment, the operation of the step S550 is the same as that of the step S420. The insulating protective layer 510 is an insulation unit. The insulating protective layer 510 includes a barrier layer 514 and a porous layer 516, please refer to the above for details, which will not be repeated here.

In the method for manufacturing the array substrate 50 described in the above embodiment, the manufactured gate insulating layer 530 has a higher dielectric constant performance (K is in a range of 8 to 9), a higher electron mobility, and a higher compactness and hardness, a higher wear resistance and thermal insulation, a good corrosion resistance and electrical insulation, few interface defects and an excellent performance. The manufactured insulating protective layer 510 has compactness, hardness, abrasion resistance, thermal insulation, corrosion resistance, electrical insulation, adsorption capacity and alkali resistance, better sidestep coverage; and the thicknesses of the gate insulating layer 530 and the insulating protective layer 510 can be controlled, the manufactured array substrate 50 can be applied to flexible displays and OLEDs.

Further, in the method for manufacturing the array substrate 50 described in the above embodiment, the gate insulating layer 530 or the insulating protective layer 510 is manufactured in the liquid phase at a room temperature, which can prevent decrease of conductivity of the gate insulating layer 530 or the insulating protective layer 510 caused by large and convex particle groups in the deposition process. The process is simple, has a low cost, and is easy to produce and use in a large scale.

It should be understood that the operation of the step S510 is not limited to the same as the operation of the step S411. In other embodiments, the operation of the step S510 may also be the same as the process for manufacturing the insulation unit based on the array substrate in the embodiment III. The barrier layer is the gate insulating layer 530. The unoxidized portion of the aluminum layer is the gate 520. Please refer to the above for details which will not be repeated here. It should be understood that the operation of the step S510 is not limited to the operations indicated above, and the gate and the gate insulating layer can also be manufactured by other common manufacturing methods in the display technology field. For example, in other embodiments, a metal layer and a photoresist layer are sequentially arranged on the substrate; through the yellow light processing, the photoresist layer is exposed and developed, and the metal layer is etched to pattern the metal layer to obtain the gate, and an aluminum oxide layer is deposited on the gate to form the gate insulating layer.

It should be understood that the operation of the step S550 is not limited to the same as the operation of the step S420. In other embodiments, the operation of the step S550 may be the same as that of the step S220. It should be understood that the operation of the step S550 is not limited to the operations indicated above, and the insulating protective layer 510 can be manufactured by other commonly used methods for manufacturing the insulating protective layer 510, for example, aluminum nitride is manufactured by using a plasma enhanced chemical vapor deposition mode to obtain the insulating protective layer 510.

In addition, an array substrate 50 is further provided according to an embodiment, which is manufactured by using the method for manufacturing the array substrate 50 in the above embodiment.

The above-mentioned array substrate 50 has an excellent performance and can be utilized to manufacture a display panel with the excellent performance.

Further, a display mechanism is also provided according to an embodiment, which includes the array substrate 50 in the above embodiment.

In an embodiment, the display mechanism is a display panel. Further, the display panel 10 is a liquid crystal display panel, an Organic Light-Emitting Diode (OLED) display panel, or a Quantum Dot Light Emitting Diode (QLED) display panel. The above-mentioned display panel 10 has a higher refresh rate and a shorter charging time, and can be utilized to manufacture a display device with an excellent performance.

Figure 11:
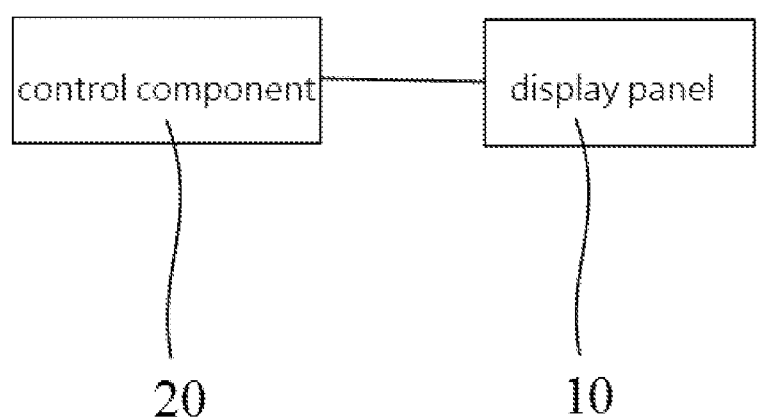
FIG. 11 is a schematic structure diagram of a display mechanism including the array substrate shown in FIG. 10.

It should be noted that the display mechanism is not limited to a display panel, please also refer to FIG. 11. In other embodiments, the display mechanism includes a display panel 10 and a control component 20. The display panel 10 includes an array substrate 50.

Figure 12:
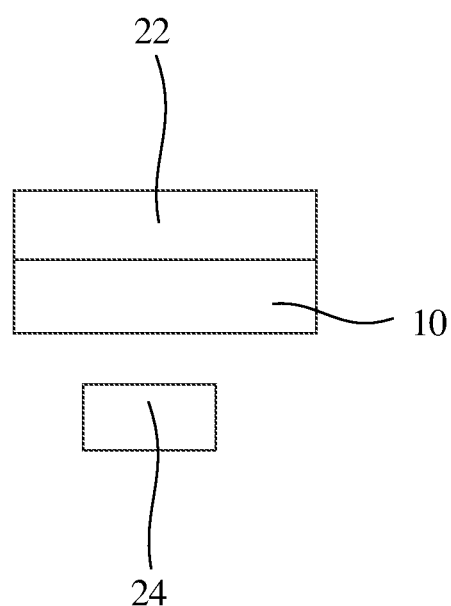
FIG. 12 is a schematic structure diagram of the display mechanism shown in FIG. 11.

Please also refer to FIG. 12, in an embodiment, the control component 20 includes at least one of a polarization module 22 and a backlight module 24. The backlight module 24 is configured to provide a backlight, and the polarization module 22 is configured to polarize a light ray. Furthermore, the control component 20 includes the polarization module 22 and the backlight module 24; the polarization module 22 and the backlight module 24 are located on both sides of the display panel 10.

In an embodiment, the display mechanism is a liquid crystal display device, an OLED display device or a QLED display device.

In an embodiment, the display mechanism is a curved display panel. It should be noted that the display device is not limited to a curved display panel, and may also be a flat display panel.

Specific embodiments are provided as follows.

Unless otherwise specified, the following embodiments do not include other components except unavoidable impurities. The drugs and instruments used in the embodiments are conventional choices in the field unless otherwise specified. The experimental methods without specifying specific conditions in the embodiments are implemented in accordance with conventional conditions, such as conditions described in the prior art or methods recommended by the manufacturer.

Unless otherwise specified, in the following embodiments, a schematic structure diagram of an array substrate is shown in FIG. 11.

Embodiment I

A process of manufacturing an array substrate in the embodiment is as follows.

(1) A gate is formed on a substrate, and a gate insulating layer is formed on a side of the substrate adjacent to a gate, and the gate insulating layer covers the gate. Specific steps are as follows.

(a) An aluminum layer is deposited on the substrate; a thickness of the aluminum layer is 5000 A.

(b) A photoresist is coated on a side of the aluminum layer away from the substrate to obtain a photoresist layer.

(c) The aluminum layer on which the developed photoresist layer is formed is placed in an etching solution for etching, and the photoresist layer is peeled off to obtain the aluminum layer with a gate pattern. The etching solution includes oxalic acid, phosphoric acid and nitric acid. The etching duration is 78 s.

(d) The aluminum layer with the gate pattern is anodized in an electrolyte to oxidize the aluminum layer to form a gate insulating layer (i.e., an insulation unit), and an unoxidized portion of the aluminum layer is the gate. The electrolyte includes borate with a mass percentage of 2%. The borate is sodium borate. An oxidation voltage is 5V. The duration of the anodization is 50 s. A temperature of the anodization is 20° C.

(2) An active layer is deposited on a side of the insulating layer away from the substrate, the active layer is an amorphous silicon layer, and a thickness of the active layer is 1500 A.

(3) Source and drain electrodes are provided on a side of the active layer away from the substrate.

(4) An aluminum layer is formed on a side of the substrate adjacent to the active layer, and the aluminum layer covers the gate insulating layer, the active layer and the source and drain electrodes.

(5) The aluminum layer is anodized in a first electrolyte under a first oxidation voltage to oxidize the aluminum layer to form a barrier layer. The first electrolyte includes borate with a mass percentage of 2%. The borate is sodium borate. The first oxidation voltage is 5V. The duration of the anodization is 70 s. The temperature of the anodization is 20° C.

(6) The aluminum layer with the barrier layer is placed in a second electrolyte for anodization under a second oxidation voltage to partially oxidize the barrier layer to form a porous layer, and an unoxidized portion of the barrier layer and the porous layer form an insulating protective layer and the array substrate is obtained. The second electrolyte includes $H_2SO_4$ with a concentration of 0.2 mol/L. A second oxidation potential is 3V. The duration of the anodization is 75 s.

Embodiment II

A process of manufacturing an array substrate in the embodiment is as follows.

(1) A gate is formed on a substrate, and a gate insulating layer is formed on a side of the substrate adjacent to the gate, and the gate insulating layer covers the gate. Specific steps are as follows.

(a) An aluminum layer is deposited on the substrate. A thickness of the aluminum layer is 9000 A.

(b) A photoresist is coated on a side of the aluminum layer away from the substrate to obtain a photoresist layer.

(c) The aluminum layer on which the developed photoresist layer is formed is placed in an etching solution for etching, and the photoresist layer is peeled off to obtain the aluminum layer with a gate pattern. The etching solution includes oxalic acid, phosphoric acid and nitric acid. The etching duration is 78 s.

(d) The aluminum layer with the gate pattern is anodized in an electrolyte to oxidize the aluminum layer to form a gate insulating layer (i.e., an insulation unit), and an unoxidized portion of the aluminum layer is the gate. The electrolyte includes borate with a mass percentage of 8%. The borate is sodium borate. The oxidation voltage is 40V. The duration of the anodization is 30 s. The temperature of the anodization is 30° C.

(2) An active layer is deposited on a side of the insulating layer away from the substrate, the active layer is an amorphous silicon layer, and the thickness of the active layer is 1500 A.

(3) Source and drain electrodes are provided on a side of the active layer away from the substrate.

(4) An aluminum layer is formed on a side of the substrate adjacent to the active layer, and the aluminum layer covers the gate insulating layer, the active layer and the source and drain electrodes.

(5) The aluminum layer is anodized in the first electrolyte under a first oxidation voltage to oxidize the aluminum layer to form a barrier layer. The first electrolyte includes borate with a mass percentage of 8%. The borate is sodium borate. The first oxidation voltage is 40V. The duration of the anodization is 40 s. The temperature of the anodization is 30° C.

(6) The aluminum layer with the barrier layer is placed in a second electrolyte for anodization under the second oxidation voltage to partially oxidize the barrier layer to form a porous layer, and an unoxidized portion of the barrier layer and the porous layer form the insulating protective layer and the array substrate is obtained. The second electrolyte includes $H_2SO_4$ with a concentration of 0.6 mol/L. The second oxidation potential is 20V. The duration of the anodization is 55 s.

Embodiment III

A process of manufacturing an array substrate in the embodiment is as follows.

(1) A gate is formed on a substrate, and a gate insulating layer is formed on a side of the substrate adjacent to the gate, and the gate insulating layer covers the gate. Specific steps are as follows.

(a) An aluminum layer is deposited on the substrate. The thickness of the aluminum layer is 7000 A.

(b) A photoresist is coated on a side of the aluminum layer away from the substrate to obtain a photoresist layer.

(c) The aluminum layer on which the developed photoresist layer is formed is placed in an etching solution for etching, and the photoresist layer is peeled off to obtain the aluminum layer with a gate pattern. The etching solution includes oxalic acid, phosphoric acid and nitric acid. The etching duration is 78 s.

(d) The aluminum layer with the gate pattern is anodized in an electrolyte to oxidize the aluminum layer to form a gate insulating layer (i.e., an insulation unit), and an unoxidized portion of the aluminum layer is the gate. The electrolyte includes borate with a mass percentage of 4%. The borate is sodium borate. The oxidation voltage is 20V. The duration of the anodization is 40 s. The temperature of the anodization is 25° C.

(2) An active layer is deposited on a side of the insulating layer away from the substrate, the active layer is an amorphous silicon layer, and the thickness of the active layer is 1500 A.

(3) Source and drain electrodes are provided on a side of the active layer away from the substrate.

(4) An aluminum layer is formed on a side of the substrate adjacent to the active layer, and the aluminum layer covers the gate insulating layer, the active layer and the source and drain electrodes.

(5) The aluminum layer is anodized in the first electrolyte under the first oxidation voltage to oxidize the aluminum layer to form a barrier layer. The first electrolyte includes borate with a mass percentage of 4%. The borate is sodium borate. The first oxidation voltage is 25V. The duration of the anodization is 50 s. The temperature of the anodization is 25° C.

(6) The aluminum layer with the barrier layer is placed in the second electrolyte for anodization under the second oxidation voltage to partially oxidize the barrier layer to form a porous layer, and an unoxidized portion of the barrier layer and the porous layer form the insulating protective layer, and the array substrate is obtained. The second electrolyte includes $H_2SO_4$ with a concentration of 0.4 mol/L. The oxidation potential is 10V. The duration of the anodization is 60 s.

Embodiment IV

A process of manufacturing an array substrate in the embodiment is substantially the same as that of Embodiment I, except the following contents.

In step (1), the electrolyte includes phosphate with a mass percentage of 3%. The phosphate is sodium phosphate.

In step (5), the first electrolyte includes phosphate with a mass percentage of 3%. The phosphate is sodium phosphate.

In step (6), the second electrolyte includes $H_3PO_4$ with a concentration of 0.1 mol/L. The second oxidation potential is 20V. The duration of the anodization is 60 s.

Embodiment V

A process of manufacturing an array substrate in the embodiment is substantially the same as that of Embodiment IV, except the following contents.

In step (1), the electrolyte includes phosphate with a mass percentage of 20%. The phosphate is sodium phosphate.

In step (5), the first electrolyte includes phosphate with a mass percentage of 20%. The phosphate is sodium phosphate.

In step (6), the second electrolyte includes $H_3PO_4$ with a concentration of 0.5 mol/L. The second oxidation potential is 60V. The duration of the anodization is 45 s.

Embodiment VI

A process of manufacturing an array substrate in the embodiment is substantially the same as that of Embodiment IV, except the following contents.

In step (1), the electrolyte includes phosphate with a mass percentage of 15%. The phosphate is sodium phosphate.

In step (5), the first electrolyte includes phosphate with a mass percentage of 15%. The phosphate is X phosphate.

In step (6), the second electrolyte includes $H_3PO_4$ with a concentration of 0.3 mol/L. The second oxidation potential is 40V. The duration of the anodization is 50 s.

Embodiment VII

A process of manufacturing an array substrate in the embodiment is substantially the same as that of Embodiment I, except the following contents.

In step (1), the electrolyte includes tartaric acid with a mass percentage of 5%.

In step (5), the first electrolyte includes tartaric acid with a mass percentage of 5%.

In step (6), the second electrolyte includes HOOCCOOH with a concentration of 0.2 mol/L. The second oxidation potential is 160V. The duration of the anodization is 90 s.

Embodiment VIII

A process of manufacturing an array substrate in the embodiment is substantially the same as that of Embodiment VII, except the following contents.

In step (1), the electrolyte includes tartaric acid with a mass percentage of 25%.

In step (5), the first electrolyte includes tartaric acid with a mass percentage of 25%.

In step (6), the second electrolyte includes HOOCCOOH with a concentration of 0.8 mol/L. The second oxidation potential is 220V. The duration of the anodization is 70 s.

Embodiment IX

A process of manufacturing an array substrate in the embodiment is substantially the same as that of Embodiment VII, except the following contents.

In step (1), the electrolyte includes tartaric acid with a mass percentage of 15%.

In step (5), the first electrolyte includes tartaric acid with a mass percentage of 15%.

In step (6), the second electrolyte includes HOOCCOOH with a concentration of 0.5 mol/L. The second oxidation potential is 190V. The duration of the anodization is 80 s.

Embodiment X

A process of manufacturing an array substrate in the embodiment is as follows.

(1) A gate is formed on a substrate, and a gate insulating layer is formed on a side of the substrate adjacent to the gate, and the gate insulating layer covers the gate. Specific steps are as follows.

(a) An aluminum layer is deposited on the substrate; a thickness of the aluminum layer is 7000 A.

(b) A photoresist is coated on a side of the aluminum layer away from the substrate to obtain a photoresist layer.

(c) The aluminum layer on which the developed photoresist layer is formed is placed in an etching solution for etching, and the photoresist layer is peeled off to obtain the aluminum layer with a gate pattern. The etching solution includes oxalic acid, phosphoric acid and sulfuric acid. The etching duration is 75 s.

(d) The aluminum layer is anodized under an oxidation current to oxidize the aluminum layer to form a gate insulating layer. A density of the oxidation current is 0.05 mA/cm². The duration of the anodization is 60 s. The temperature of the anodization is 25° C. The electrolyte is sodium borate with a mass percentage of 3%.

(2) An active layer is deposited on a side of the insulating layer away from the substrate, the active layer is an amorphous silicon layer, and a thickness of the active layer is 1500 A.

(3) Source and drain electrodes are provided on a side of the active layer away from the substrate.

(4) An aluminum layer is formed on a side of the substrate adjacent to the active layer, and the aluminum layer covers the gate insulating layer, the active layer and the source and drain electrodes.

(5) The aluminum layer is anodized under a first oxidation current to oxidize the aluminum layer to form a barrier layer. A density of the first oxidation current is 0.05 mA/cm$^2$. The duration of the anodization is 75 s. The temperature of the anodization is 25° C. The electrolyte is sodium borate with a mass percentage of 3%.

(6) The aluminum layer with the barrier layer is anodized under a second oxidation current to partially oxidize the barrier layer to form a porous layer, and an unoxidized portion of the barrier layer and the porous layer form an insulating protective layer and the array substrate is obtained. The density of the second oxidation current is 0.5 mA/cm$^2$ to obtain an array substrate. The duration of the anodization is 40 s. The temperature of the anodization is 25° C. The electrolyte is $H_2SO_4$ with a concentration of 0.4 mol/L.

Embodiment XI

A process of manufacturing an array substrate in the embodiment is substantially the same as that of the Embodiment III, except the following contents.

In step (1), a gate is formed on a substrate, and a gate insulating layer is formed on a side of the substrate adjacent to the gate, and the gate insulating layer covers the gate. Specific steps are as follows.

(a) An aluminum layer is deposited on the substrate; a thickness of the aluminum layer is 4000 A.

(b) A photoresist is coated on a side of the aluminum layer away from the substrate to obtain a photoresist layer.

(c) The aluminum layer on which the developed photoresist layer is formed is placed in an etching solution for etching, and the photoresist layer is peeled off to obtain the aluminum layer with a gate pattern. The etching solution includes oxalic acid, phosphoric acid and sulfuric acid. The etching duration is 70 s.

(d) A plasma enhanced chemical vapor deposition process is utilized to deposit an aluminum nitride layer on the aluminum layer with the gate pattern, to form a gate insulating layer.

Embodiment XII

A process of manufacturing an array substrate in the embodiment is substantially the same as that of the Embodiment X, except the following contents.

In step (1), a gate is formed on a substrate, and a gate insulating layer is formed on a side of the substrate adjacent to the gate, and the gate insulating layer covers the gate. Specific steps are as follows.

(a) An aluminum layer is deposited on the substrate; the thickness of the aluminum layer is 5000 A.

(b) A photoresist is coated on a side of the aluminum layer away from the substrate to obtain a photoresist layer.

(c) The aluminum layer on which the developed photoresist layer is formed is placed in an etching solution for etching, and the photoresist layer is peeled off to obtain the aluminum layer with a gate pattern. The etching solution includes oxalic acid, phosphoric acid and sulfuric acid. The etching duration is 75 s.

(d) A plasma enhanced chemical vapor deposition process is utilized to deposit an aluminum nitride layer on the aluminum layer with the gate pattern to form a gate insulating layer.

Embodiment XIII

A process of manufacturing an array substrate in the embodiment is as follows.

(1) A gate is formed on a substrate, and a gate insulating layer is formed on a side of the substrate adjacent to the gate, and the gate insulating layer covers the gate. Specific steps are as follows.

(a) An aluminum layer is deposited on the substrate; a thickness of the aluminum layer is 7000 A.

(b) A photoresist is coated on a side of the aluminum layer away from the substrate to obtain a photoresist layer.

(c) The aluminum layer on which the developed photoresist layer is formed is placed in an etching solution for etching, and the photoresist layer is peeled off to obtain the aluminum layer with a gate pattern. The etching solution includes oxalic acid, phosphoric acid and sulfuric acid. The etching duration is 85 s.

(d) The aluminum layer with the gate pattern is anodized in the first electrolyte to oxidize the aluminum layer to form a gate insulating layer (i.e., an insulation unit), and an unoxidized portion of the aluminum layer is the gate. The first electrolyte includes borate with a mass percentage of 4%. The borate is sodium borate. The first oxidation voltage is 20V. The duration of the anodization is 60 s. The temperature of the anodization is 25° C.

(2) An active layer is deposited on a side of the insulating layer away from the substrate, the active layer is an amorphous silicon layer, and the thickness of the active layer is 1500 A.

(3) Source and drain electrodes are provided on a side of the active layer away from the substrate.

(4) A plasma enhanced chemical vapor deposition process is utilized to form an aluminum nitride layer (that is, an insulating protective layer) on a side of the substrate adjacent to the active layer, and the aluminum nitride layer covers the gate insulating layer, the active layer and the source and drain electrodes, and the array substrate is obtained.

Embodiment XIV

A process of manufacturing an array substrate in the embodiment is as follows.

(1) A gate is formed on a substrate, and a gate insulating layer is formed on a side of the substrate adjacent to the gate, and the gate insulating layer covers the gate. Specific steps are as follows.

(a) An aluminum layer is deposited on a substrate; a thickness of the aluminum layer is 7000 A.

(b) A photoresist is coated on a side of the aluminum layer away from the substrate to obtain a photoresist layer.

(c) The aluminum layer on which the developed photoresist layer is formed is placed in an etching solution for etching, and the photoresist layer is peeled off to obtain the aluminum layer with a gate pattern. The etching solution includes oxalic acid, phosphoric acid and sulfuric acid. The etching duration is 85 s.

(d) The aluminum layer is anodized under an oxidation current to oxidize the aluminum layer to form a gate insulating layer. A density of the oxidation current is 0.05 mA/cm$^2$. The duration of the anodization is 55 s. The temperature of the anodization is 25° C. The electrolyte is sodium borate with a mass percentage of 3%.

(2) An active layer is deposited on a side of the insulating layer away from the substrate, the active layer is an amorphous silicon layer, and the thickness of the active layer is 1500 A.

(3) Source and drain electrodes are provided on a side of the active layer away from the substrate.

(4) A plasma enhanced chemical vapor deposition process is utilized to form an aluminum nitride layer (that is, an insulating protective layer) on a side of the substrate adjacent to the active layer, and the aluminum nitride layer covers the gate insulating layer, the active layer and the source and drain electrodes, and the array substrate is obtained.

Test:

(1) A relative dielectric constant, a corrosion resistance and a resistivity of the gate insulating layer in the array substrates of the embodiments I to XIV are measured. The measurement results are shown in Table 1. A dielectric constant tester is utilized to measure the relative dielectric constant. A salt spray test chamber is utilized to measure the corrosion resistance of 72 h. The resistivity is measured by a four-probe method.

TABLE 1

| | Relative dielectric constant | 72 h corrosion resistance (PH = 6.8, T = 35 ± 2° C., RH > 95%) | resistivity (*$10^{12}$Ω cm) |
|---|---|---|---|
| Embodiment I | 6.8 | Slightly corroded appearance | 3.5 |
| Embodiment II | 7.4 | No abnormal appearance | 3.8 |
| Embodiment III | 7.8 | No abnormal appearance | 4.4 |
| Embodiment IV | 7.0 | No abnormal appearance | 3.6 |
| Embodiment V | 7.2 | No abnormal appearance | 3.8 |
| Embodiment VI | 7.6 | No abnormal appearance | 4.3 |
| Embodiment VII | 7.0 | No abnormal appearance | 4.2 |
| Embodiment VIII | 7.4 | No abnormal appearance | 4.1 |
| Embodiment IX | 7.8 | No abnormal appearance | 4.5 |
| Embodiment X | 7.1 | No abnormal appearance | 4.0 |
| Embodiment XI | 6.9 | No abnormal appearance | 4.0 |
| Embodiment XII | 6.8 | Slightly corroded appearance | 3.9 |
| Embodiment XIII | 6.6 | Slightly corroded appearance | 3.7 |
| Embodiment XIV | 6.7 | Slightly corroded appearance | 3.7 |

It can be seen from Table 1 that the gate insulating layer manufactured by the method of controlling the voltage and controlling the electrolyte concentration in the solution has a higher dielectric constant and resistivity, and the corrosion resistance thereof is better.

(2) The corrosion resistance, electrical insulation, adsorption capacity, and alkali resistance of the insulating protective layer in the array substrates of embodiments I to XIV are measured. The measurement results are shown in Table 2. A dielectric constant tester is utilized to measure the relative dielectric constant. A salt spray test chamber is utilized to measure the corrosion resistance of 72 h. The resistivity is measured by the four-probe method. Water vapor permeability is measured by using a water vapor permeameter.

TABLE 2

| | Water vapor permeability (g/m²/24 h) | Corrosion resistance of 72 h (PH = 6.8, T = 35 ± 2° C., RH > 95%) | Resistivity (*$10^{12}$ Ω cm) | Relative dielectric constant |
|---|---|---|---|---|
| Embodiment I | 4.6 | Slightly corroded appearance | 3.0 | 5.5 |
| Embodiment II | 4.0 | Slightly corroded appearance | 3.5 | 6.2 |
| Embodiment III | 3.5 | No abnormal appearance | 3.8 | 6.8 |
| Embodiment IV | 4.1 | No abnormal appearance | 3.1 | 6.4 |
| Embodiment V | 3.9 | No abnormal appearance | 3.3 | 6.7 |
| Embodiment VI | 3.6 | No abnormal appearance | 3.6 | 6.9 |
| Embodiment VII | 4.0 | No abnormal appearance | 3.5 | 6.2 |
| Embodiment VIII | 4.0 | No abnormal appearance | 3.5 | 6.2 |
| Embodiment IX | 4.1 | No abnormal appearance | 3.8 | 6.5 |
| Embodiment X | 4.1 | No abnormal appearance | 3.6 | 6.3 |
| Embodiment XI | 4.2 | No abnormal appearance | 3.6 | 6.1 |
| Embodiment XII | 4.4 | No abnormal appearance | 3.4 | 5.9 |
| Embodiment XIII | 4.6 | Slightly corroded appearance | 3.2 | 5.8 |
| Embodiment XIV | 4.6 | Slightly corroded appearance | 3.1 | 5.8 |

It can be seen from Table 2 that the insulating protective layer manufactured by the method of controlling the voltage and controlling the electrolyte concentration in the solution has a higher water vapor barrier performance.

The technical features of the above-mentioned embodiments can be combined arbitrarily. In order to make the description concise, all possible combinations of the various technical features in the above-mentioned embodiments are not described. However, as long as there is no contradiction in the combination of these technical features, all should be considered as the scope of the present disclosure.

The above-mentioned embodiments are merely several exemplary embodiments of the present disclosure, and the description is relatively specific and detailed, but it should not be understood as a limitation on the scope of the present disclosure. It should be pointed out that those of ordinary skill in the art can make several variations and improvements without departing from the concept of the present disclosure, and these all fall within the protection scope of the present disclosure. Therefore, the protection scope of the present disclosure should be subject to the appended claims.

What is claimed is:

1. A method for manufacturing an insulation unit based on an array substrate, comprising:
   providing an aluminum layer on a substrate;
   anodizing the aluminum layer in a first electrolyte to oxidize the aluminum layer to form a barrier layer; and
   placing the aluminum layer with the barrier layer in a second electrolyte for anodization, to partially oxidize the barrier layer to form a porous layer;
   wherein the porous layer and an unoxidized portion of the barrier layer form the insulation unit.

2. The method for manufacturing the insulation unit based on the array substrate according to claim 1, wherein the first electrolyte includes at least one of borate with a mass percentage of 1% to 8%, phosphate with a mass percentage of 3% to 20%, and tartaric acid with a mass percentage of 5% to 25%.

3. The method for manufacturing the insulation unit based on the array substrate according to claim 1, wherein the second electrolyte comprises at least one of $H_2SO_4$ with a concentration of 0.2 mol/L to 0.6 mol/L, $H_3PO_4$ with a concentration of 0.1 mol/L to 0.5 mol/L, and HOOCCOOH with a concentration of 0.2 mol/L to 0.8 mol/L.

4. The method for manufacturing the insulation unit based on the array substrate according to claim 1, wherein the anodizing the aluminum layer in the first electrolyte to oxidize the aluminum layer to form the barrier layer comprises: anodizing the aluminum layer in the first electrolyte under a first oxidation current to oxidize the aluminum layer to form the barrier layer, and a density of the first oxidation current is in a range of 0.01 mA/cm$^2$ to 0.1 mA/cm$^2$.

5. The method for manufacturing the insulation unit based on the array substrate according to claim 1, further comprising: after anodizing the aluminum layer in the first electrolyte under a first oxidation current to oxidize the aluminum layer to form the barrier layer, anodizing the aluminum layer with the barrier layer under a second oxidation current to partially oxidize the barrier layer to form the porous layer, wherein a density of the second oxidation current is in a range of 0.4 mA/cm$^2$ to 2 mA/cm$^2$.

6. The method for manufacturing the insulation unit based on the array substrate according to claim 1, wherein the insulation unit is a gate insulating layer, and the anodizing the aluminum layer in the first electrolyte to oxidize the aluminum layer to form the barrier layer comprises:
  forming a photoresist layer on a side of the aluminum layer away from the substrate;
  exposing and then developing the photoresist layer;
  etching the aluminum layer on which the developed photoresist layer is formed, to remove the photoresist layer to obtain the aluminum layer with a gate pattern; and
  anodizing the aluminum layer with the gate pattern to oxidize a surface of the aluminum layer to form the insulation unit, wherein an unoxidized portion of the aluminum layer is a gate, and the insulation unit covers the gate.

7. The method for manufacturing the insulation unit based on the array substrate according to claim 1, wherein the providing the aluminum layer on the substrate comprises:
  forming a gate on the substrate, forming a gate insulating layer on a side of the substrate adjacent to the gate, the gate insulating layer covering the gate;
  forming an active layer on a side of the gate insulating layer away from the substrate;
  forming source and drain electrodes on a side of the active layer away from the gate insulating layer; and
  forming the aluminum layer on a side of the substrate adjacent to the active layer, the aluminum layer covering the gate insulating layer, the active layer, and the source and drain electrodes.

8. An insulation unit based on an array substrate, manufactured by the method for manufacturing the insulation unit based on the array substrate according to claim 1.

9. A method for manufacturing an array substrate, comprising:
  providing an aluminum layer on a substrate;
  anodizing the aluminum layer to oxidize a surface of the aluminum layer to form a gate insulating layer;
  forming an active layer on a side of the gate insulating layer away from the substrate;
  forming source and drain electrodes on a side of the active layer away from the gate insulating layer;
  forming a metal layer on a side of the substrate adjacent to the active layer, the metal layer covering the gate insulating layer, the active layer, and the source and drain electrodes, a material of the metal layer being aluminum; and
  anodizing the metal layer to oxidize the metal layer to form an insulating protective layer to obtain the array substrate;
  wherein the anodizing the metal layer to oxidize the metal layer to form the insulating protective layer comprises:
  anodizing the metal layer in a first electrolyte to oxidize the metal layer to form a barrier layer; and
  anodizing the metal layer with the barrier layer in a second electrolyte to partially oxidize the barrier layer to form a porous layer; and
  wherein an unoxidized portion of the aluminum layer is a gate, and the gate insulating layer covers the gate.

10. The method for manufacturing the array substrate according to claim 9, wherein the anodizing the aluminum layer comprises: anodizing the aluminum layer in an electrolyte; the electrolyte comprises at least one of borate with a mass percentage of 1% to 8%, phosphate with a mass percentage of 3% to 20%, and tartaric acid with a mass percentage of 5% to 25%.

11. The method for manufacturing the array substrate according to claim 9, wherein the anodizing the aluminum layer comprises:
  anodizing the aluminum layer under an oxidation current; a density of the oxidation current is in a range of 0.01 mA/cm$^2$ to 0.1 mA/cm$^2$.

12. The method for manufacturing the array substrate according to claim 9, wherein the first electrolyte comprises at least one of borate with a mass percentage of 1% to 8%, phosphate with a mass percentage of 3% to 20% and tartaric acid with a mass percentage of 5% to 25%; and
  wherein the porous layer and an unoxidized portion of the barrier layer form the insulating protective layer, the second electrolyte comprises at least one of $H_2SO_4$ with a concentration of 0.2 mol/L to 0.6 mol/L, $H_3PO_4$ with a concentration of 0.1 mol/L to 0.5 mol/L, and HOOC-COOH with a concentration of 0.2 mol/L to 0.8 mol/L.

13. The method for manufacturing the array substrate according to claim 9, wherein the anodizing the metal layer to oxidize the metal layer to form the insulating protective layer comprises:
  anodizing the metal layer in the first electrolyte under a first oxidation current to oxidize the metal layer to form the barrier layer, a density of the first oxidation current being in a range of 0.01 mA/cm$^2$ to 0.1 mA/cm$^2$; and
  anodizing the metal layer with the barrier layer in the second electrolyte under a second oxidation current to partially oxidize the barrier layer to form the porous layer, wherein the porous layer and an unoxidized portion of the barrier layer form the insulating protective layer, a density of the second oxidation current is in a range of 0.4 mA/cm$^2$ to 2 mA/cm$^2$.

14. A method for manufacturing an array substrate, comprising:
  forming a gate on a substrate, forming a gate insulating layer on a side of the substrate adjacent to the gate, the gate insulating layer covering the gate;
  forming an active layer on a side of the gate insulating layer away from the substrate;
  forming source and drain electrodes on a side of the active layer away from the gate insulating layer;

forming a metal layer on a side of the substrate adjacent to the active layer, wherein the metal layer covers the gate insulating layer, the active layer, and the source and drain electrodes, a material of the metal layer is aluminum; and anodizing the metal layer to oxidize the metal layer to form an insulating protective layer to obtain the array substrate;

wherein the anodizing the metal layer to oxidize the metal layer to form the insulating protective layer comprises:

anodizing the metal layer in a first electrolyte to oxidize the metal layer to form a barrier layer, and anodizing the metal layer with the barrier layer in a second electrolyte, to partially oxidize the barrier layer to form a porous layer.

15. The method for manufacturing the array substrate according to claim 14, wherein the first electrolyte comprises at least one of borate with a mass percentage of 1% to 8%, phosphate with a mass percentage of 3% to 20% and tartaric acid with a mass percentage of 5% to 25%; and wherein the porous layer and an unoxidized portion of the barrier layer form the insulating protective layer, the second electrolyte comprises at least one of $H_2SO_4$ with a concentration of 0.2 mol/L to 0.6 mol/L, $H_3PO_4$ with a concentration of 0.1 mol/L to 0.5 mol/L, and HOOC-COOH with a concentration of 0.2 mol/L to 0.8 mol/L.

16. The method for manufacturing the array substrate according to claim 14, wherein the anodizing the metal layer to oxidize the metal layer to form the insulating protective layer comprises:

anodizing the metal layer under a first oxidation current to oxidize the metal layer to form the barrier layer, wherein a density of the first oxidation current is less than a preset value, and the preset value is in a range of 0.1 mA/cm$^2$ to 0.4 mA/cm$^2$; and anodizing the metal layer with the barrier layer under a second oxidation current to partially oxidize the barrier layer to form the porous layer, wherein the porous layer and an unoxidized portion of the barrier layer form the insulating protective layer, a density of the second oxidation current is greater than the preset value.

17. An array substrate, manufactured by the method for manufacturing the array substrate according to claim 9.

18. An electronic device, comprising the array substrate of claim 17.

* * * * *